United States Patent
Chen et al.

(10) Patent No.: US 8,835,211 B1
(45) Date of Patent: Sep. 16, 2014

(54) IMAGE SENSOR PIXEL CELL WITH GLOBAL SHUTTER HAVING NARROW SPACING BETWEEN GATES

(71) Applicant: Omnivision Technologies, Inc., Santa Clara, CA (US)

(72) Inventors: Gang Chen, San Jose, CA (US); Duli Mao, Sunnyvale, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/901,958

(22) Filed: May 24, 2013

(51) Int. Cl.
*H01L 21/00* (2006.01)
*H01L 31/18* (2006.01)
*H01L 27/148* (2006.01)

(52) U.S. Cl.
CPC .......... *H01L 27/14806* (2013.01); *H01L 31/18* (2013.01)
USPC ............................................. 438/80; 257/225

(58) Field of Classification Search
USPC ...................... 257/253, 22, E27.06, E21.422, 257/E29.255, E29.3, E29.166, E29.242, 257/225; 438/57, 60, 59, 80, 49, 104, 423, 438/72, 113, 155, 197, 22, 29, 48
See application file for complete search history.

(56) References Cited

U.S. PATENT DOCUMENTS 6,664,191 B1 12/2003 Kim et al.
8,089,036 B2 1/2012 Manabe

OTHER PUBLICATIONS

Webb, C., "45nm Design for Manufacturing", Intel Technology Journal, vol. 12, Issue 2, Jun. 17, 2008 (12 pages).

*Primary Examiner* — Julio J Maldanado
*Assistant Examiner* — Robert Bachner
(74) *Attorney, Agent, or Firm* — Blakely Sokoloff

(57) ABSTRACT

A pixel cell includes a photodiode, a storage transistor, a transfer transistor and an output transistor disposed in a semiconductor substrate. The transfer transistor selectively transfers image charge accumulated in the photodiode from the photodiode to the storage transistor. The output transistor selectively transfers the image charge from the storage transistor to a readout node. A first isolation fence is disposed over the semiconductor substrate separating a transfer gate of the transfer transistor from a storage gate of the storage transistor. A second isolation fence is disposed over the semiconductor substrate separating the storage gate from an output gate of the output transistor. Thicknesses of the first and second isolation fences are substantially equal to spacing distances between the transfer gate and the storage gate, and between the storage gate and the output gate, respectively.

5 Claims, 4 Drawing Sheets

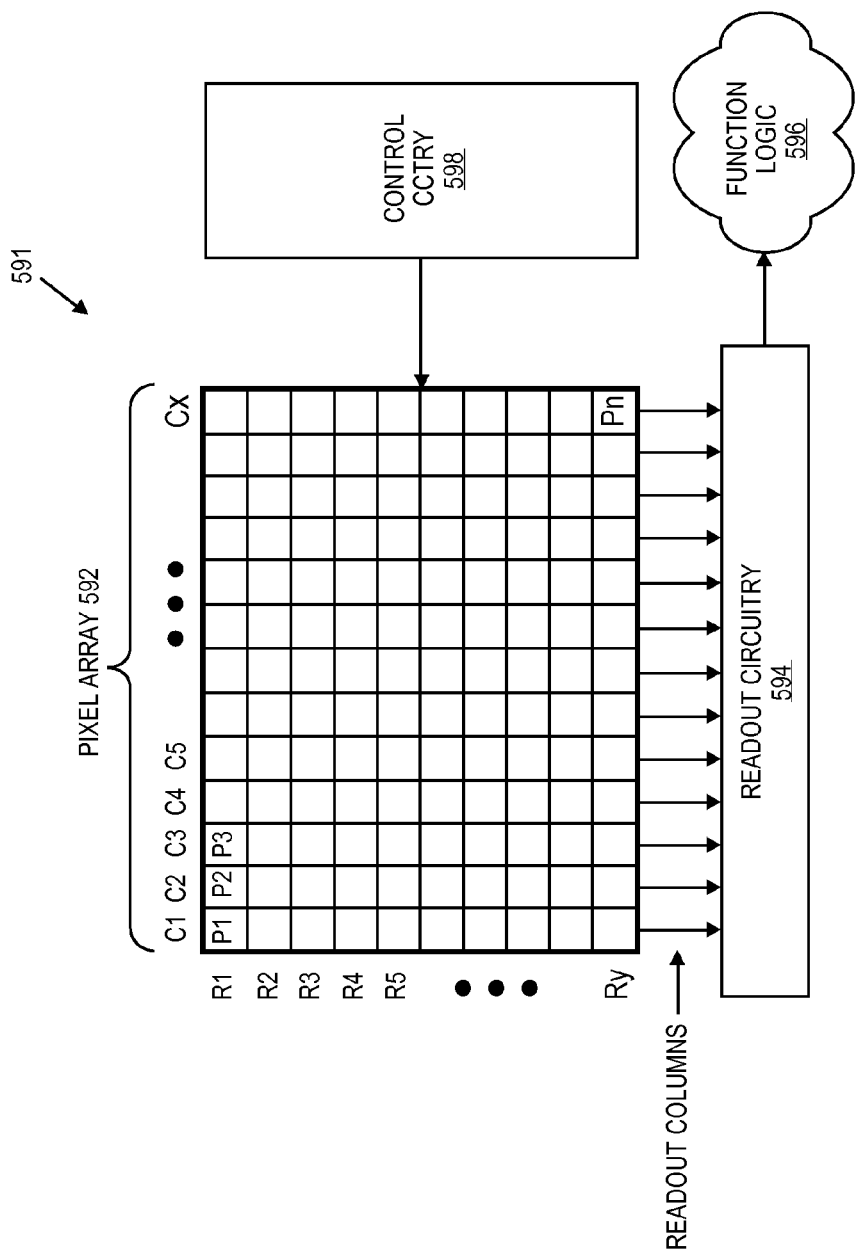

IMAGE SENSOR PIXEL CELL WITH GLOBAL SHUTTER HAVING NARROW SPACING BETWEEN GATES

BACKGROUND INFORMATION

1. Field of the Disclosure

The present invention relates generally semiconductor processing. More specifically, examples of the present invention are related to semiconductor processing of image sensor pixel cells having global shutters.

2. Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects the time differential between each row generates image distortion. For fast-moving objects, a rolling shutter causes a perceptible elongation distortion along the object's axis of movement.

To implement a global shutter, storage capacitors or storage transistors can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell. Factors that affect performance in an image sensor pixel cell having a global shutter include shutter efficiency, dark current, white pixels and image lag. The spacing between the transfer, storage and output gates of the transfer, storage and output transistors, respectively, may have a significant impact on these factors. In general, the performance of the image sensor pixel cell is improved as the spacing distance between the transfer, storage and output gate electrodes is decreased. However, the minimum spacing distance allowed by the polysilicon-to-polysilicon design rules in semiconductor device fabrication processes limits how closely spaced together the gate can be in an image sensor pixel cell having a global shutter.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

FIG. 5 is a diagram illustrating one example of an imaging system including a pixel array having pixel cells with etched isolation fences in accordance with the teachings of the present invention.

Figure 1:
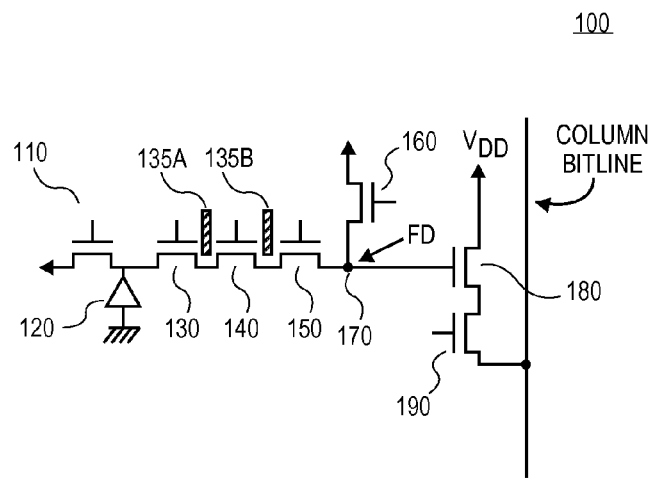
FIG. 1 is a schematic illustrating one example of a pixel cell in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to image sensor pixel cells with isolation fences between gates are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

As will be shown, an imaging system having image sensor pixel cells with isolation fences between gates in accordance with the teachings of the present invention enables an image sensor pixel cell array with a global shutter having narrow spaces between gates. As will be discussed in further detail below, the narrow spacings between the gates of the pixel cells in accordance with the teachings of the present invention overcome the minimum polysilicon-to-polysilicon design rule limitations by providing isolation fences between the gates, which have thicknesses that are fabricated in accordance with smaller minimum line width design rule limitations. Thus, by achieving close spacing between the storage gate and its adjacent gates in with isolation fences in pixel cells with a global shutter, transfer efficiency is improved and reduced image lag are realized in accordance with the teachings of the present invention. In addition, with the narrow spacing between gates achieved with the isolation fences in accordance with the teachings of the present invention, the gates substantially shield light from leaking between the gates without the need for double polysilicon processes used for example in charge coupled device (CCD) semiconductor device fabrication processes.

To illustrate, FIG. 1 is a schematic illustrating one example of a pixel cell 100 with a global shutter in accordance with the teachings of the present invention. As shown in the depicted example, pixel cell 100 includes a shutter transistor 110, a photodiode 120, a transfer transistor 130, a storage transistor 140, an output transistor 150, a floating diffusion 170, a reset transistor 160, an amplifier transistor 180, and a row-select transistor 190 coupled to a column bitline as shown. As shown in the depicted example, a first isolation fence 135A is disposed between the gate of transfer transistor 130 and the gate of storage transistor 140 in accordance with the teachings of the present invention. In one example, a thickness of the first isolation fence 135A is substantially equal to a spacing distance between the gate of transfer transistor 130 and the gate of storage transistor 140. In addition, a second isolation fence 135B is disposed between the gate of storage transistor 140 and the gate of output transistor 150 in accordance with the teachings of the present invention. In one example, a thickness of the second isolation fence 135B is substantially equal to a spacing distance between the gate of storage transistor 140 and the gate of output transistor 150.

Figure 2:
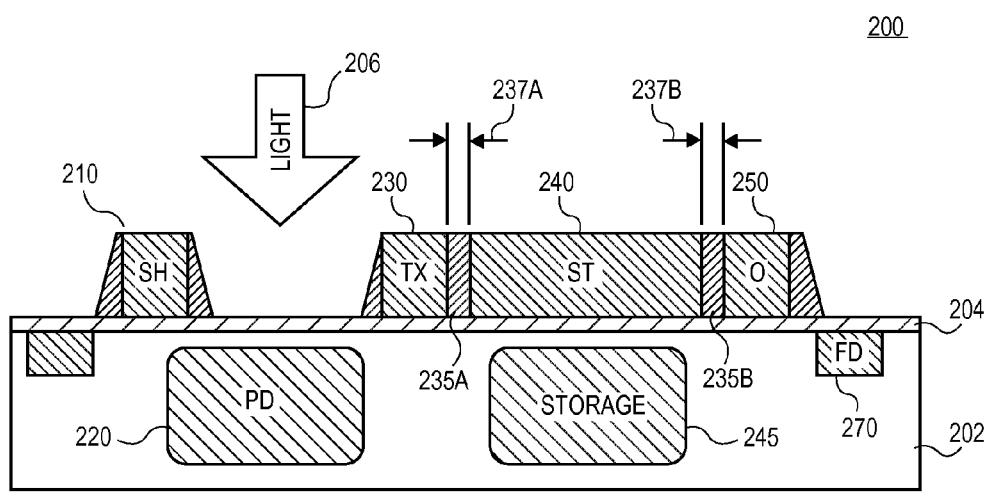
FIG. 2 is a cross-section view illustrating one example of a pixel cell in accordance with the teachings of the present invention.

FIG. 2 is a cross-section view illustrating one example of a pixel cell 200 in accordance with the teachings of the present invention. It is noted that pixel cell 200 of FIG. 2 in one example is a cross-section view of pixel cell 100 of FIG. 1, and that similarly named and numbered elements referenced below are coupled and function similar to as described above. As shown in the example depicted in FIG. 2, pixel cell 200 includes a photodiode 220 disposed in a semiconductor substrate 202 to accumulate image charge from light 206, which is directed thereto. In one example, a shutter transistor, including a shutter gate 210 disposed over gate oxide 204 and the semiconductor substrate 202, is included in pixel cell 200, which may be utilized in order to selectively deplete (photo-voltaically generated) charges in photodiode 220. A storage transistor, including a storage gate 240 disposed over gate oxide 204 and the semiconductor substrate 202, is disposed in the semiconductor substrate 202 to store the image charge. A transfer transistor, including a transfer gate 230 disposed over gate oxide 204 and the semiconductor substrate 202, is disposed between the photodiode 220 and the storage transistor to selectively transfer the image charge from the photodiode 220 to the storage transistor. An output transistor, including an output gate 250 disposed over gate oxide 204 and the semiconductor substrate 202, is disposed in the semiconductor substrate 202 and coupled to an output of the storage transistor to selectively transfer the image charge from the storage transistor to a readout node, which in one example includes the floating diffusion 270 disposed in the semiconductor substrate 202. In one example, shutter gate 210, transfer gate 230, storage gate 240 and output gate 250 include polysilicon.

Continuing with the example depicted in FIG. 2, a first isolation fence 235A is disposed over the semiconductor substrate 202 separating the transfer gate 230 from the storage gate 240 as shown. Similarly, a second isolation fence 235B is disposed over the semiconductor substrate 202 separating the storage gate 240 from the output gate 250 as shown. In one example, the isolation fences 235A and 235B include nitride. In the depicted example, a thickness 237A of the first isolation fence 235A is substantially equal to a spacing distance between the transfer gate 230 and the storage gate 240 as shown. Similarly, a thickness 237B of the second isolation fence 235B is substantially equal to a spacing distance between the storage gate 240 and the output gate 250 as shown.

In one example, the thicknesses 237A and 237B are substantially equal to a thickness as narrow as the minimum line width allowed according to the design rules of a semiconductor device fabrication process. Accordingly, the spacing distance between the transfer gate 230 from the storage gate 240 and the spacing distance between the storage gate 240 from the output gate 250 can be as narrow as the minimum line width according to the design rules of a semiconductor device fabrication process in accordance with the teachings of the present invention. In one example, the minimum line width according to the design rules of a semiconductor device fabrication process is less than the minimum polysilicon-to-polysilicon spacing distance according to the design rules of the semiconductor device fabrication process in accordance with the teachings of the present invention. Therefore, the spacing distances between transfer gate 230, the storage gate 240 and the output gate 250 with isolation fences 237A and 237B are narrower than they would be without isolation fences 237A and 237B because the design rule limitations of the minimum polysilicon-to-polysilicon spacing is greater than the minimum line width design rule limitations in the semiconductor device fabrication process. For instance, in one example with 65 nm technology, the minimum polysilicon-to-polysilicon spacing limitation is approximately 0.12 microns while the minimum line width design rule limitation of the semiconductor fabrication process is 0.06 microns.

It is appreciated that with the narrow spacing distance between the transfer gate 230 and the storage gate 240 achieved with isolation fence 237A, and the narrow spacing distance between the storage gate 240 and the output gate 250 achieved with isolation fence 237B, key performance factors of pixel cell 200, including shutter efficiency, dark current, white pixels and image lag are improved in accordance with the teachings of the present invention. In addition, it is appreciated that with the spacing between the transfer gate 230 and the storage gate 240, as well as the spacing distance between the storage gate 240 and the output gate 250 are sufficiently narrow such that the transfer gate 230, the storage gate 240 and the output gate 250 substantially shield light 206 from leaking between the transfer gate 230, the storage gate 240 and the output gate 250, which therefore eliminates the need for extra double polysilicon processing steps in accordance with the teachings of the present invention.

Figure 3:
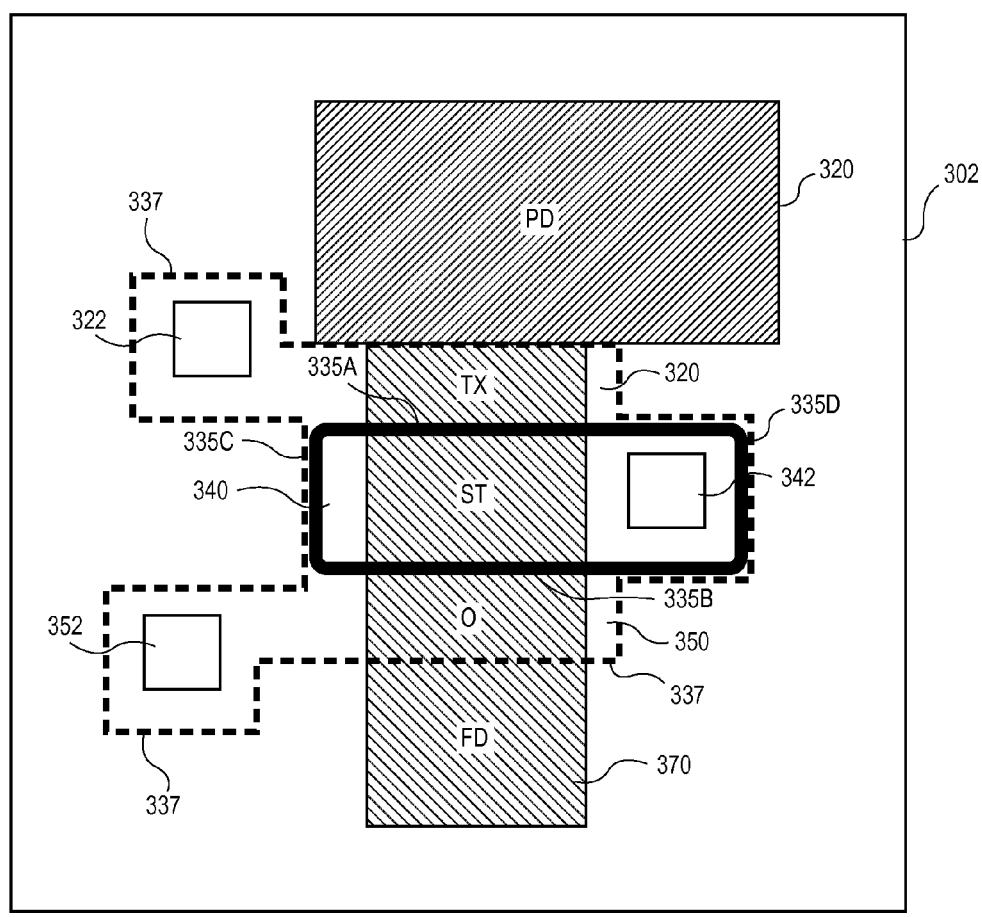
FIG. 3 is a top-view diagram illustrating one example of the layout of a portion of a pixel cell in accordance with the teachings of the present invention.

FIG. 3 is a top-view diagram illustrating one example of the layout of a portion of a pixel cell 300 in accordance with the teachings of the present invention. It is noted that pixel cell 300 of FIG. 3 in one example is a top-view of pixel cell 100 of FIG. 1 and/or of pixel cell 200 of FIG. 2, and that similarly named and numbered elements referenced below are coupled and function similar to as described above. The example depicted in FIG. 3 illustrates the active regions and the individual gate regions of some of the transistors pixel cell 300 in accordance with the teachings of the present invention. Specifically, FIG. 3 illustrates the layout of transfer transistor gate 320, storage gate 340 and output gate 350 with respect to photodiode 320 and floating diffusion 370, which are disposed in semiconductor substrate 302. As shown, a contact 332 is coupled to transfer gate 320, a contact 342 is coupled to storage gate 340, and a contact 352 is coupled to output gate 350. Photodiode 320 is disposed in semiconductor substrate 302 as shown and is selectively coupled to transfer the image charge through the transfer transistor, the storage transistor, and the output transistor to the floating diffusion 370. In one example, the storage gate can have a buried channel or a surface channel. In one example, the storage gate 340 is formed above a dielectric region that is in turn above a region implanted (or diffused) with a light dopant such as for example phosphorus or arsenic. In one example, there is channel doping connecting the transfer transistor, the storage transistor, and the output transistor to the floating diffusion 370.

In the example depicted in FIG. 3, the dark rectangle including sides 335A, 335B, 335C and 335D represents first isolation fence 335A, second isolation fence 335B, and supporting ends 335C and 335D. In example, the first isolation fence 335A, second isolation fence 335B, and supporting ends 335C and 335D include nitride and are fabricated to have thicknesses as narrow as the minimum line thickness allowed according to the design rules of the semiconductor fabrication process in accordance with the teachings of the present invention. In one example using a 65 nm process, the thicknesses of first isolation fence 335A and second isolation fence 335B are as narrow as 0.06 microns. Continuing with the depicted example, the dashed line 337 represents the polysilicon gate mask that may be used to deposit the polysilicon included in transfer gate 320, storage gate 340 and output gate 350 after the nitride fence including first isolation fence 335A, second isolation fence 335B, and supporting ends 335C and 335D has been deposited in accordance with the teachings of the present invention. In one example, the polysilicon gate mask may also include a spacer formed around it in accordance with the teachings of the present invention.

Figure 4A:
FIG. 4A illustrates a cross-section view of one example of a semiconductor substrate layer with a sacrificial oxide growth in accordance with the teachings of the present invention.

FIGS. 4A-4H are cross-section views illustrating a pixel cell 400 at various stages during fabrication in accordance with the teachings of the present invention. It is noted that pixel cell 400 of FIGS. 4A-4H illustrate cross-section views during various stages of fabrication of pixel cell 100 of FIG. 1 and/or pixel cell 200 of FIG. 2 and/or pixel cell 300 of FIG. 3, and that similarly named and numbered elements referenced below are coupled and function similar to as described above. To illustrate, FIG. 4A shows a cross-section view of one example during fabrication of pixel cell 400 including a semiconductor substrate layer 402 with a sacrificial oxide growth 403 in accordance with the teachings of the present invention. In one example, it is appreciated that sacrificial oxide growth 403 has a thickness that is sufficient to stop a nitride etch in later fabrication steps.

Figure 4B:
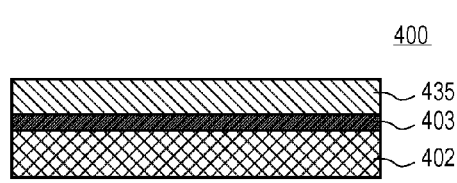
FIG. 4B illustrates a cross-section view of one example of a semiconductor substrate layer with nitride deposited over a sacrificial oxide growth in accordance with the teachings of the present invention.

FIG. 4B illustrates the cross-section view of the example of pixel cell 400 including the semiconductor substrate layer 402 with nitride 435 deposited over the sacrificial oxide growth 403 in accordance with the teachings of the present invention.

Figure 4C:
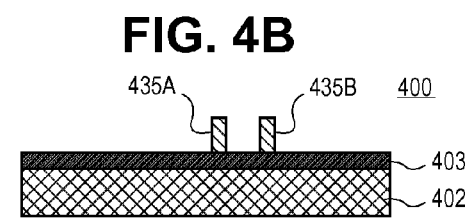
FIG. 4C illustrates a cross-section view of one example of a semiconductor substrate layer having etched isolation fences in accordance with the teachings of the present invention.

FIG. 4C illustrates the cross-section view of the example of pixel cell 400 including the semiconductor substrate layer 402 having isolation fences 435A and 435B etched from nitride layer 435 in accordance with the teachings of the present invention. In one example, isolation fences 435A and 435B have thicknesses as narrow as the minimum line width allowed according to the design rules of the semiconductor fabrication process, which in one example is approximately 0.06 microns. In addition, in one example, the isolation fences 435A and 435B have a height of approximately 0.150 microns.

Figure 4D:
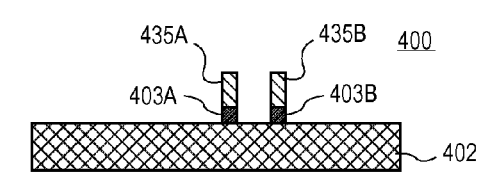
FIG. 4D illustrates a cross-section view of one example of a semiconductor substrate layer having etched isolation fences with the sacrificial oxide layer etched away from exposed portions of the semiconductor substrate layer in accordance with the teachings of the present invention.

FIG. 4D illustrates the cross-section view the example of pixel cell 400 including the semiconductor substrate layer 402 having the etched isolation fences 435A and 435B with the sacrificial oxide layer 403 etched away from the exposed portions of the semiconductor substrate layer 402 that are not covered by isolation fences 435A and 435B in accordance with the teachings of the present invention.

Figure 4E:
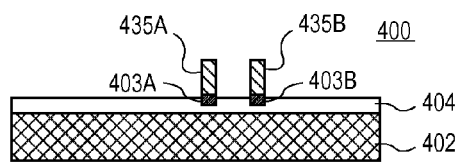
FIG. 4E illustrates a cross-section view of one example of a semiconductor substrate layer having etched isolation fences with a gate oxide layer grown over the semiconductor substrate layer in accordance with the teachings of the present invention.

FIG. 4E illustrates the cross-section view of the example of pixel cell 400 including the semiconductor substrate layer 402 having the etched isolation fences 435A and 435B with a gate oxide layer 404 grown over the semiconductor substrate layer 402 in accordance with the teachings of the present invention. In one example, the gate oxide layer 404 has a thickness of approximately 3 to 5 nm.

Figure 4F:
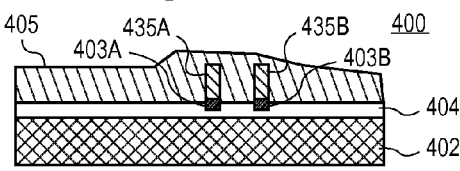
FIG. 4F illustrates a cross-section view of one example of a semiconductor substrate layer having a polysilicon layer deposited over the etched isolation fences and gate oxide layer in accordance with the teachings of the present invention.

FIG. 4F illustrates the cross-section view the example of pixel cell 400 including semiconductor substrate layer 402 having a polysilicon layer 405 deposited over the etched isolation fences 435A and 435B and the gate oxide layer 404 in accordance with the teachings of the present invention.

Figure 4G:
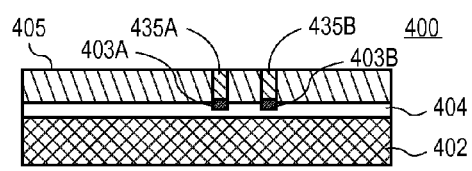
FIG. 4G illustrates a cross-section view of one example of a polysilicon layer over a semiconductor substrate layer with etched isolation fences after chemical-mechanical polishing in accordance with the teachings of the present invention.

FIG. 4G illustrates the cross-section view the example of pixel cell 400 including the polysilicon layer 405 over the semiconductor substrate layer 402 with etched isolation fences 435A and 435B after chemical-mechanical polishing (CMP) in accordance with the teachings of the present invention. In one example, the chemical-mechanical polishing is performed to planarize the polysilicon layer 405 and is stopped once the nitride of etched isolation fences 435A and 435B is reached as shown in accordance with the teachings of the present invention.

Figure 4H:
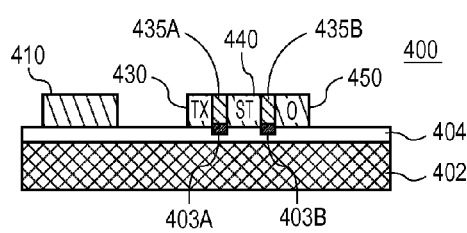
FIG. 4H illustrates a cross-section view of one example of a shutter gate, a transfer gate, a storage gate and an output gate patterned from a polysilicon layer over a semiconductor substrate layer with etched isolation fences in accordance with the teachings of the present invention.

FIG. 4H illustrates the cross-section view the example of pixel cell 400 including a shutter gate 410, a transfer gate 430, a storage gate 440 and an output gate 450 that have been patterned from the polysilicon layer 405 over the semiconductor substrate layer 402. As shown in the depicted example, the etched isolation fences 435A and 435B separate the transfer gate 430, storage gate 440 and output gate 450. As shown in the depicted example, the thickness of the first isolation fence 435A is substantially equal to the spacing distance between the transfer gate 430, storage gate 440 in accordance with the teachings of the present invention. Similarly, the thickness of the second isolation fence 435B is substantially equal to the spacing distance between storage gate 440 and output gate 450 in accordance with the teachings of the present invention.

FIG. 5 is a diagram illustrating one example of an imaging system 591 including an example pixel array 592 having a plurality of image sensor pixels cells in accordance with the teachings of the present invention. As shown in the depicted example, imaging system 591 includes pixel array 592 coupled to control circuitry 598 and readout circuitry 594, which is coupled to function logic 596.

In one example, pixel array 592 is a two-dimensional (2D) array of image sensor pixel cells (e.g., pixels P1, P2, P3, . . . , Pn). It is noted that the pixel cells P1, P2, . . . Pn in the pixel array 592 may be examples of pixel cell 100 of FIG. 1 and/or of pixel cell 200 of FIG. 2 and/or pixel cell 300 of FIG. 3, and/or pixel cell 400 of FIGS. 4A-4H, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell P1, P2, P3, . . . , Pn has acquired its image data or image charge, the image data is readout by readout circuitry 594 and then transferred to function logic 596. In various examples, readout circuitry 594 may include amplification circuitry, analog-to-digital (ADC) conversion circuitry, or otherwise. Function logic 596 may simply store the image data or even manipulate the image data by applying post image effects (e.g., crop, rotate, remove red eye, adjust brightness, adjust contrast, or otherwise). In one example, readout circuitry 594 may readout a row of image data at a time along readout column lines (illustrated) or may readout the image data using a variety of other techniques (not illustrated), such as a serial readout or a full parallel readout of all pixels simultaneously.

In one example, control circuitry 598 is coupled to pixel array 592 to control operational characteristics of pixel array 592. In one example, control circuitry 598 is coupled to generate a global shutter signal for controlling image acquisition for each pixel cell. In the example, the global shutter signal simultaneously enables all pixels cells P1, P2, P3, . . . , Pn within pixel array 592 to simultaneously enable all of the pixel cells in pixel array 592 to simultaneously transfer the image charge from each respective photodiode during a single acquisition window.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of fabricating pixel cell, comprising;
etching a nitride layer deposited over a semiconductor substrate to form first and second isolation fences from the nitride layer, wherein the first and second isolation fences have first and second thicknesses, respectively;
growing a gate oxide layer over the semiconductor substrate;
depositing a polysilicon layer over the gate oxide layer;
patterning the polysilicon layer to form a storage gate of a storage transistor between the first and second isolation fences;
patterning the polysilicon layer to form a transfer gate of a transfer transistor proximate to the first isolation fence opposite the storage gate, such that a spacing distance between the transfer gate and the storage gate is substantially equal to the first thickness; and
patterning the polysilicon layer to form an output gate of an output transistor proximate to the second isolation fence opposite the storage gate, such that a spacing distance between the storage gate and the output gate is substantially equal to the second thickness.

2. The method of claim 1 further comprising:
growing a sacrificial oxide on a semiconductor substrate prior to etching the nitride layer;
depositing the nitride layer over the sacrificial oxide grown on the semiconductor substrate prior to etching the nitride layer; and
removing exposed portions of the sacrificial oxide from the semiconductor substrate after etching the nitride layer.

3. The method of claim 1 further comprising chemical-mechanical polishing (CMP) the polysilicon layer to planarize the polysilicon layer down to the first and second isolation fences prior to patterning the polysilicon layer.

4. The method of claim 1 wherein the first and second thicknesses are less than a minimum polysilicon-to-polysilicon spacing distance of a semiconductor device fabrication process.

5. The method of claim 1 wherein the first and second thicknesses are substantially equal to a minimum line width of a semiconductor device fabrication process.

* * * * *